(12) United States Patent
Hsu et al.

(10) Patent No.: US 11,631,601 B2
(45) Date of Patent: Apr. 18, 2023

(54) TRANSFER HEAD FOR TRANSFERRING MICRO ELEMENT AND TRANSFERRING METHOD OF MICRO ELEMENT

(71) Applicant: XIAMEN SANAN OPTOELECTRONICS TECHNOLOGY CO., LTD., Xiamen (CN)

(72) Inventors: Chen-ke Hsu, Xiamen (CN); Jiansen Zheng, Xiamen (CN); Xiaojuan Shao, Xiamen (CN); Kechuang Lin, Xiamen (CN)

(73) Assignee: XIAMEN SANAN OPTOELECTRONICS TECHNOLOGY CO., LTD., Xiamen (CN)

(*) Notice: Subject to any disclaimer, the term of this patent is extended or adjusted under 35 U.S.C. 154(b) by 102 days.

(21) Appl. No.: 17/139,976

(22) Filed: Dec. 31, 2020

(65) Prior Publication Data
US 2021/0125847 A1   Apr. 29, 2021

Related U.S. Application Data

(63) Continuation of application No. 15/859,659, filed on Dec. 31, 2017, now Pat. No. 10,916,458, which is a (Continued)

(30) Foreign Application Priority Data

Sep. 30, 2016  (CN) .................... 201610865727.5
Sep. 30, 2016  (CN) .................... 201610865728.X

(51) Int. Cl.
*H01L 21/67* (2006.01)
*B65G 61/00* (2006.01)
*H01L 21/683* (2006.01)

(52) U.S. Cl.
CPC ........ *H01L 21/67144* (2013.01); *B65G 61/00* (2013.01); *H01L 21/6838* (2013.01); *Y10T 29/53191* (2015.01)

(58) Field of Classification Search
CPC ......... Y10T 29/53191; Y10T 29/53178; Y10T 29/53174; Y10T 29/5313; Y10T 29/53
(Continued)

(56) References Cited

U.S. PATENT DOCUMENTS

2002/0017834 A1* 2/2002 MacDonald .......... B81B 3/0027
                                                310/328
2015/0013152 A1* 1/2015 Tada ....................... H05K 13/08
                                                29/739

FOREIGN PATENT DOCUMENTS

CN       1533238 A  *  9/2004
JP    2008118122 A  *  5/2008   ......... H05K 13/0409

* cited by examiner

*Primary Examiner* — Peter Dungba Vo
*Assistant Examiner* — Azm A Parvez
(74) *Attorney, Agent, or Firm* — Syncoda LLC; Feng Ma

(57) ABSTRACT

A method of making a transfer head for transferring micro elements, wherein the transfer head includes a cavity with a plurality of vacuum paths and a suite having arrayed suction nozzles and vacuum paths. The suction nozzles are connected to the vacuum path components respectively, and the vacuum path components are formed to connect to vacuum paths in the cavity respectively. The suction nozzles attract or release the micro element through vacuum pressure transmitted by vacuum. When the suite is mounted in the cavity, the upper surface of the suite is arranged with optical switching components for controlling the switch of the vacuum path components and vacuum paths of each path so that the suction nozzles can attract or release required micro element through vacuum pressure; and fabricating a suite with an array micro-hole structure, wherein the array micro- (Continued)

hole structure serves as the vacuum path components and the suction nozzles.

14 Claims, 9 Drawing Sheets

Related U.S. Application Data continuation of application No. PCT/CN2016/104868, filed on Nov. 7, 2016.

(58) Field of Classification Search
USPC ......... 29/743, 729, 700, 739, 740, 832, 829, 29/825, 592.1
See application file for complete search history.

TRANSFER HEAD FOR TRANSFERRING MICRO ELEMENT AND TRANSFERRING METHOD OF MICRO ELEMENT

CROSS-REFERENCE TO RELATED APPLICATIONS

The present application is a continuation of, and claims priority to, U.S. patent application Ser. No. 15/859,659 filed on Dec. 31, 2017, which is a continuation of, and claims priority to, PCT/CN2016/104868 filed on Nov. 7, 2016, which claims priority to Chinese Patent Application No. 201610865728.X filed on Sep. 30, 2016, and Chinese Patent Application No. 201610865727.5 filed on Sep. 30, 2016. The disclosures of these applications are hereby incorporated by reference in their entirety.

BACKGROUND

Micro element technologies involve integrating micro-size element arrays in high density over the substrate. At present, the micro light-emitting diode (Micro LED) technique is becoming a hot research topic, and the industry circle expects high-quality micro element products in the market. High-quality micro light-emitting diode products have profound impacts on conventional display products in the market, such as liquid crystal display (LCD) and organic light-emitting diode (OLED).

SUMMARY

The inventors of the present disclosure have recognized that, during fabrication of the micro element, first, a micro element is formed over the donor substrate, and then the micro element is transferred to the acceptor substrate. For example, the acceptor substrate is a display screen. One difficulty during micro element fabrication is: how to transfer the micro element from the donor substrate to the acceptor substrate.

In a conventional micro element transfer, the micro element is transferred to the acceptor substrate through a transfer substrate via wafer bonding. Direct transfer is a kind of method by directly bonding the micro element array to the acceptor substrate from the transfer substrate, and then removing the transfer substrate. Indirect transfer is the other method. This method includes two times of bonding/lifting-off steps. At first, the transfer substrate extracts the micro element array from the donor substrate, and bonds the micro element array to the acceptor substrate. Finally, remove the transfer substrate. The micro element array is generally extracted by electrostatic method. During electrostatic extraction, a transfer head array is required. The transfer head array is of complex structure, and the reliability is a factor to consider. The fabrication of transfer head array brings additional cost. Before extraction with the transfer head array, phase change is required. In addition, during fabrication of the transfer head array, thermal budget of the micro element for phase change is limited, which is generally less than 350° C., or specifically, lower than 200° C.; otherwise, the micro element performance will be degraded.

To solve the above problems, the present disclosure provides a transfer head for transferring the micro element and a transfer method for the micro element.

According to a first aspect of the present disclosure, a transfer head for transferring the micro element is provided, including: a cavity with vacuum paths; a suite having a plurality of suction nozzles and vacuum path components, wherein, the suction nozzles are connected to the vacuum path components respectively, and the vacuum path components are formed to connect to the vacuum paths in the cavity respectively, and the suction nozzles attract or release the micro element through vacuum pressure, which is transmitted by vacuum path components and vacuum paths of each path; wherein, when the suite is mounted in the cavity, the upper surface of the suite is arranged with optical switching components for controlling the switch of the vacuum path components and vacuum paths of each path so that the suction nozzles can attract or release required micro element through vacuum pressure.

In some embodiments, the optical switching component comprises a digital micromirror device (DMD) chip.

In some embodiments, the DMD chip comprises a micro reflector, wherein, by changing an angle between the micro reflector and the upper surface of the suite, the switch of the vacuum path components and vacuum paths of each path can be controlled.

In some embodiments, the angle equals to or is less than 12°.

In some embodiments, when the angle is zero, the vacuum path components and vacuum paths of each path are OFF; when the angle is not zero, the vacuum path components and vacuum paths of each path are ON.

According to a second aspect of the present disclosure, a fabrication method for the transfer head for transferring the micro element is provided, wherein, the transfer head includes: a cavity with vacuum paths; a suite having arrayed suction nozzles and vacuum path components, wherein, the suction nozzles are connected to the vacuum path components respectively, and the vacuum path components are formed to connect to vacuum paths in the cavity respectively, and the suction nozzles attract or release the micro element through vacuum pressure, which is transmitted by vacuum path components and vacuum paths of each path; when the suite is mounted in the cavity, the upper surface of the suite is arranged with optical switching components for controlling the switch of the vacuum path components and vacuum paths of each path so that the suction nozzles can attract or release required micro element through vacuum pressure, wherein: fabricate a suite with an array micro-hole structure, wherein, the array micro-hole structure serves as the vacuum path component or the suction nozzle.

In some embodiments, the array micro-hole structure is formed through laser treatment, through-silicon via (TVS), wire drawing or any of their combinations.

In some embodiments, the array micro-hole structure has a first opening and a second opening, wherein, the first opening is larger than or equals to the second opening.

In some embodiments, size of the array micro-hole structure is 1-100 µm.

In some embodiments, spacing of the array micro-hole structure is 1-100 µm.

In some embodiments, the suite material is metal, Si, porcelain, glass, plastic or any of their combination.

In some embodiments, the suction nozzle material is metal, Si, porcelain, glass, plastic or any of their combination.

In some embodiments, a conductive layer, an insulating layer or other functional layers are formed over an inner surface of the array micro-hole structure.

According to a third aspect of the present disclosure, a transfer method for transferring the micro element is provided, wherein, the transfer method for the micro element includes:

(1) placing at least one micro element over the first substrate;

(2) using any transfer head to orient and contact the micro element, wherein, the suction nozzle attracts the micro element through vacuum pressure; and controlling the switch of the vacuum path components and vacuum paths of each path via the optical switching component to extract required micro element; and (3) using any transfer head to orient and contact the second substrate, wherein, the suction nozzle releases the micro element through vacuum pressure; and controlling the switch of the vacuum path components and vacuum paths of each path via the optical switching component to release required micro element over the second substrate.

In some embodiments, a plurality of micro elements are provided, wherein, in step (2), only part of the micro elements are attracted to extract required micro elements.

In some embodiments, a plurality of micro elements are provided, wherein, in step (3), only part of the micro elements are desorbed to release required micro elements.

In some embodiments, the optical switching component includes a DMD chip.

In some embodiments, the DMD chip includes a micro reflector, wherein, by changing the angle between the micro reflector and the upper surface of the suite, the switch of the vacuum path components and vacuum paths of each path can be controlled.

In some embodiments, the angle equals to or is less than 12°.

In some embodiments, when the angle is zero, the vacuum path components and vacuum paths of each path are OFF; when the angle is not zero, the vacuum path components and vacuum paths of each path are ON.

In some embodiments, the first substrate is a growth substrate or a carrier substrate.

In some embodiments, the second substrate is an active element array substrate or a passive element array substrate.

In addition, it should be understood by those skilled in the art that despite many problems in the prior art, the technical scheme of each embodiment or claim of the present disclosure can be improved in one or several aspects. It is not necessary to solve all technical problems listed in the prior art or the background art. It should be understood by those skilled in the art that contents not mentioned in a claim shall not be construed as limiting the claim.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

Figure 1:
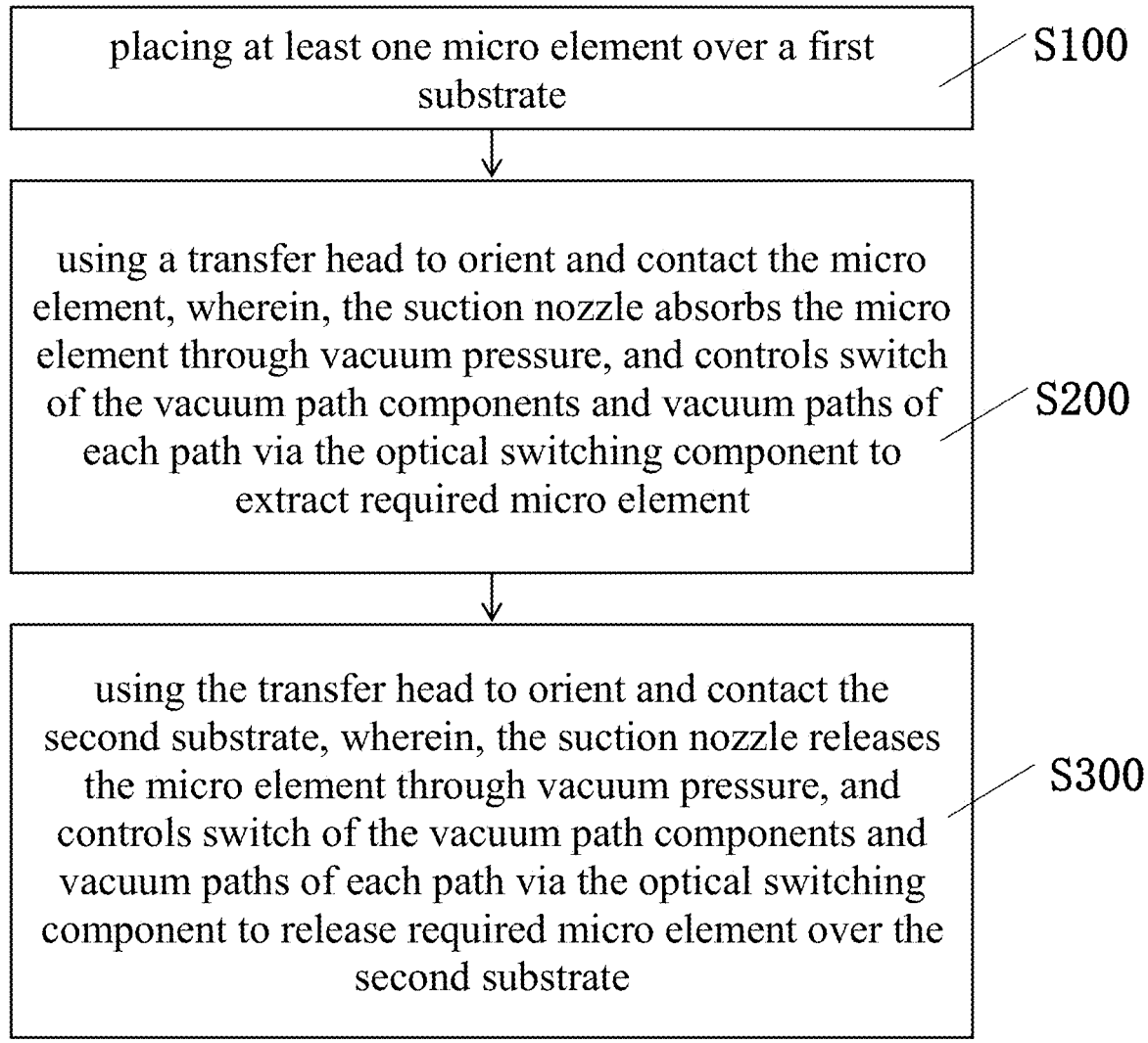
FIG. 1 shows a flow chart of the transfer method for the micro element according to Embodiment 1 of the present disclosure.

In the drawings: 100: first substrate; 200: micro element; 300: transfer head; 301: cavity with vacuum paths; 302: suite; 303: suction nozzle; 304: vacuum path component; 305: optical switching component; 306: functional layer; 3021: micro-hole structure; 3022: first opening; 3023: second opening; 400: second substrate.

DETAILED DESCRIPTION

Various exemplary embodiments of the present disclosure will be described below with reference to accompanying drawings. It should be noted that: unless explicitly stated otherwise, relative arrangement, digital expressions and values of the components and steps described in those embodiments should not be used to limit the present disclosure in any way.

Embodiment 1

FIG. 1 shows a flow chart for a transfer method for micro elements, mainly including process steps S100-S300. Step S100 includes arrange a plurality of micro elements over a first substrate; Step S200 includes using any transfer head to orient and contact the micro element, wherein, the suction nozzle attracts the micro element through vacuum pressure; and controlling the switch of the vacuum path components and vacuum paths of each path via the optical switching component to extract required micro element; and step S300 includes using any transfer head to orient and contact the second substrate, wherein, the suction nozzle releases the micro element through vacuum pressure; and controlling the switch of the vacuum path components and vacuum paths of each path via the optical switching component to release required micro element over the second substrate. Details will be given in combination with FIGS. 2-6.

Figure 2:
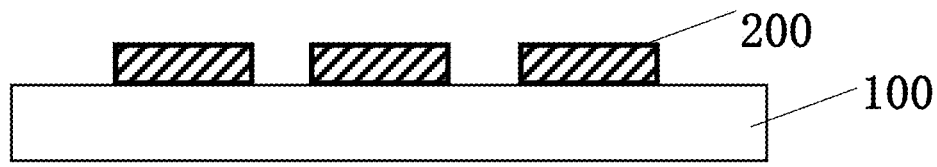
FIG. 2 shows a structural diagram in a first step of the transfer method for the micro element according to Embodiment 1 of the present disclosure, which may include: placing at least one micro element over the first substrate.

As shown in FIG. 2, a first substrate 100 is provided, which can be a growth substrate or a carrier substrate. In this embodiment, a carrier substrate is preferred, which can be glass, silicon, polycarbonate, acrylonitrile butadiene styrene or any of their combinations. It should be noted that specific embodiments of the carrier substrate aforesaid are only for illustration, and shall not be deemed as a limitation of the present disclosure. The person having ordinary skill in the art shall select specific embodiments of the first substrate 100 based on actual requirements. Arrange a plurality of micro elements 200 over the first substrate 100, wherein, the micro element can be a wafer before wafer processing technology, a light-emitting diode or a laser diode. In this embodiment, the micro element prefers to be a thin light-emitting diode with thickness of about 0.5 µm to about 100 µm. The micro element 200 can be a cylinder with radius of about 0.5 µm to about 500 µm. However, the micro element 200 is not limited to cylinder, but can be triangular column, cube, rectangular, hexagonal column, octagonal column or other polygonal cylinders.

Figure 3:
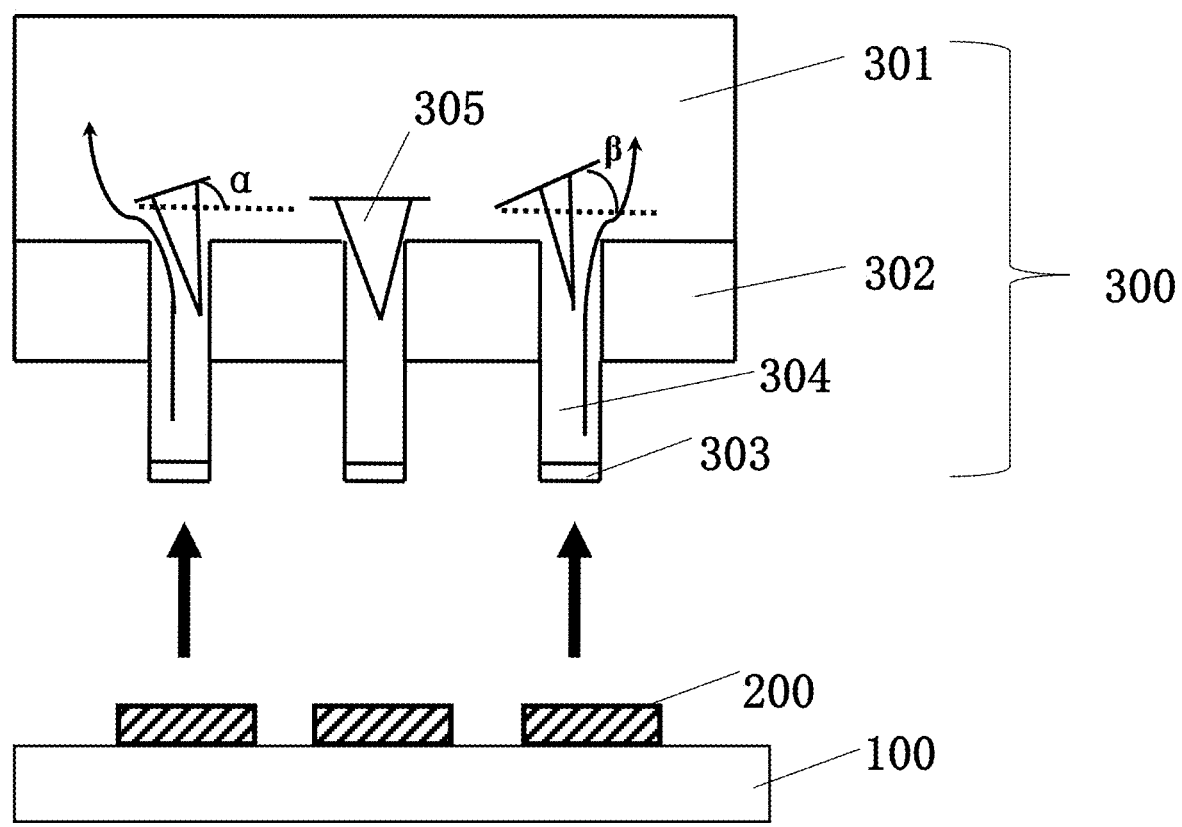
FIG. 3 shows a structural diagram in a second step of the transfer method for the micro element according to Embodiment 1 of the present disclosure, which may include: using any transfer head to orient and contact the micro element.
Figure 4:
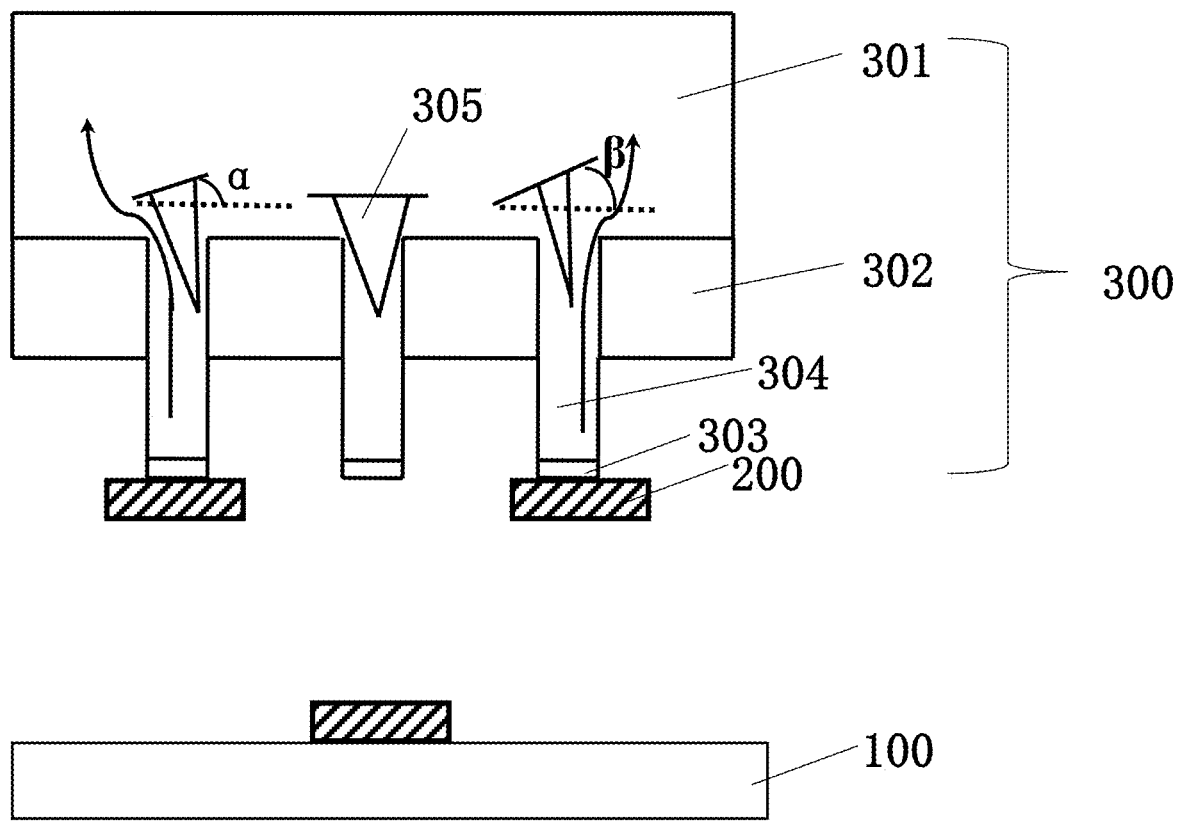
FIG. 4 shows a structural diagram in a third step of the transfer method for the micro element according to Embodiment 1 of the present disclosure, which may include: using the suction nozzle to attract the micro element through vacuum pressure; and controlling the switch of the vacuum path components and vacuum paths of each path via the optical switching component to extract required micro element

As shown in FIGS. 3 and 4, a transfer head 300 is provided, which orients towards and contacts the micro element 200 over the first substrate 100, wherein, the transfer head 300 includes: a cavity with vacuum paths 301; a suite 302 having a plurality of suction nozzles 303 and vacuum path components 304, wherein, the suction nozzles 303 are connected to the vacuum path components 304 respectively, and the vacuum path components 304 are formed to connect to vacuum paths in the cavity 301 respectively, and the suction nozzles 303 attract or release the micro element through vacuum pressure, which is transmitted by vacuum path components and vacuum paths of each path. When the suite 302 is mounted in the cavity with vacuum paths 301, the upper surface of the suite is arranged with optical switching components 305 for controlling the switch of the vacuum path components and vacuum paths of each path so that the suction nozzles can attract or release required micro element through vacuum pressure. In this embodiment, number of the suction nozzles, vacuum path components and micro elements is 3 each. Define the suction nozzles/vacuum path components/micro elements in FIG. 3 from left to right as the first, the second and the third suction nozzle/vacuum path component/micro element. To attract the first and the third micro elements over the carrier substrate 100, set the path of the first vacuum path components and vacuum paths to ON status, the path of the second vacuum path components and vacuum paths to OFF status, and the path of the third vacuum path components and vacuum paths to ON with the optical switching component 305. Specifically, the optical switching component 305 prefers to include a DMD chip, wherein, the DMD chip has a micro reflector to control the switch of the vacuum path components and vacuum paths of each path by changing the angle between the micro reflector and the upper surface of the suite. In some embodiments, the angle equals to or is less than 12°. When the angle is zero, the path of the second vacuum path component and vacuum path is OFF; when the angle α=8°, the path of the first vacuum path component and vacuum path is ON; when the angle β=12°, the path of the third vacuum path component and vacuum path is ON It should be noted that by changing the angle between the micro reflector and the upper surface of the suite, the switch of the vacuum path components and vacuum paths of each path can be controlled, and the vacuum pressure can also be adjusted.

As described above, the transfer head 300 orients and contacts the micro element 200 over the first substrate 100, wherein, the suction nozzle attracts the micro element through vacuum pressure, and controls switch of the vacuum path components and vacuum paths of each path by the optical switching component to extract required micro element.

Figure 5:
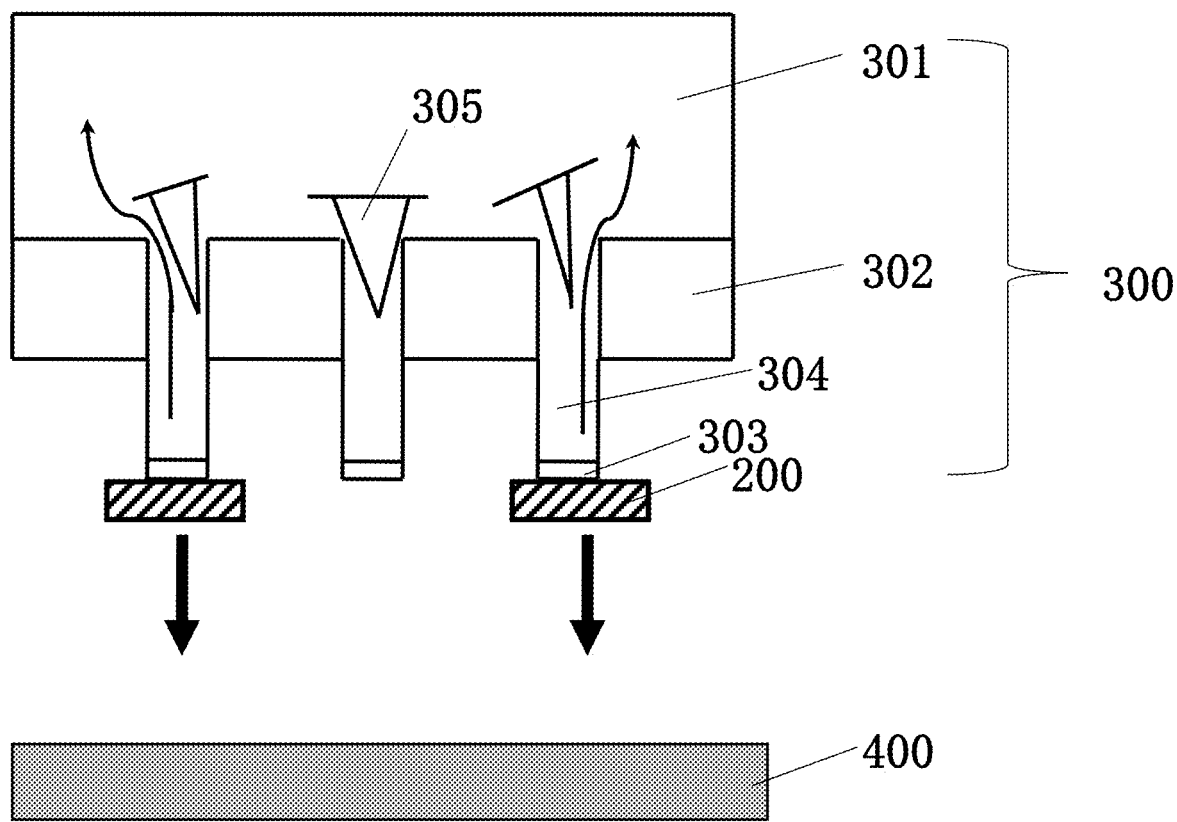
FIG. 5 shows a structural diagram in a fourth step of the transfer method for the micro element according to Embodiment 1 of the present disclosure, which may include: using any transfer head to orient and contact the second substrate.
Figure 6:
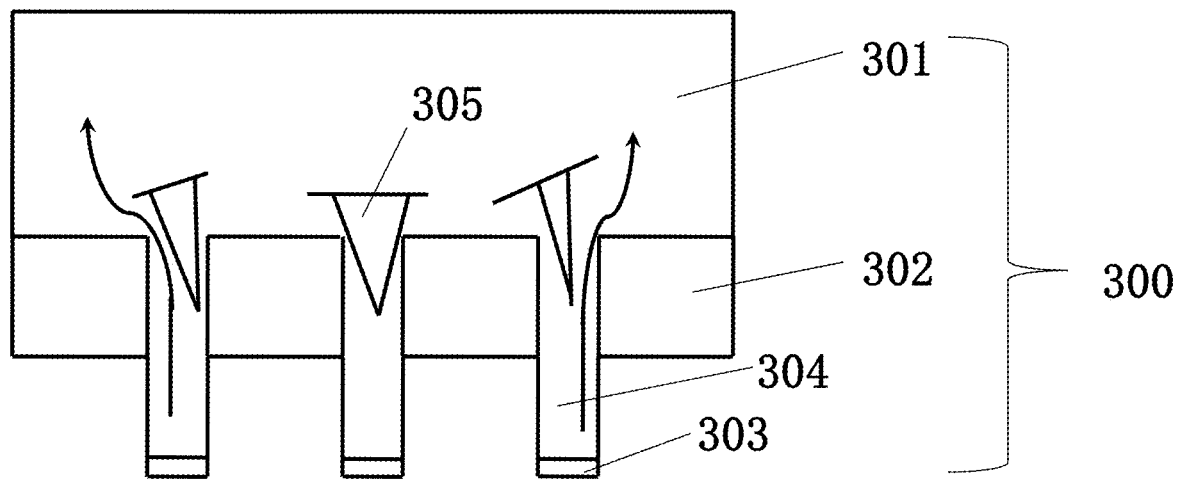
FIG. 6 shows a structural diagram in a fifth step of the transfer method for the micro element according to Embodiment 1 of the present disclosure, which may include: using the suction nozzle to release the micro element through vacuum pressure; and controlling the switch of the vacuum path components and vacuum paths of each path via the optical switching component to release required micro element over the second substrate
Figure 6:
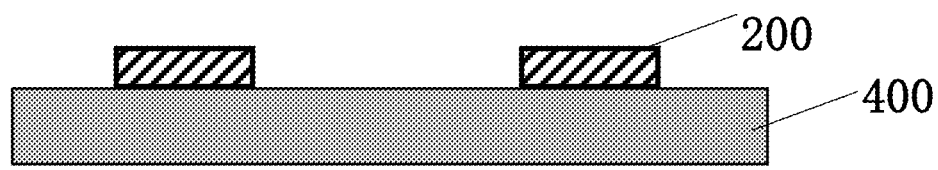

As shown in FIGS. 5 and 6, provide a second substrate 400, wherein the transfer head 300 orients the second substrate 400. The second substrate, as an acceptor substrate, can be automotive glass, glass sheet, flexible electronic substrate, such as flexible film of circuit, display back plate, solar glass, metal, polymer, polymer compound or glass fiber. The suction nozzle 303 releases the micro element 200 through vacuum pressure, and controls switch of the vacuum path components and vacuum paths of each path with the optical switching component 305, to release required micro element over the second substrate 400.

The second substrate 400 can be an active element array substrate or a passive element array substrate. In this embodiment, an active element array substrate is preferred. Therefore, the second substrate 400 and the micro element 200 would form an active display panel or other devices. The second substrate 400 and the micro element 200 can also form a light-emitting device.

It should be noted that the micro element can be fully extracted at one time or partially extracted. Further, extract partial qualified micro elements for transferring and leave unqualified micro elements; or extract unqualified micro elements and leave qualified micro elements over the first substrate so as to improve efficiency and yield of the micro element transferring.

The transferring method for the micro element according to this embodiment can also be used for fabricating electronic device, or be widely applied in electronic devices like mobile phone, tablet PC, etc.

Embodiment 2

FIGS. 7-11 show diagrams of the fabrication process of the transfer head for transferring the micro element according to the present disclosure, mainly including the following process.

Figure 7:
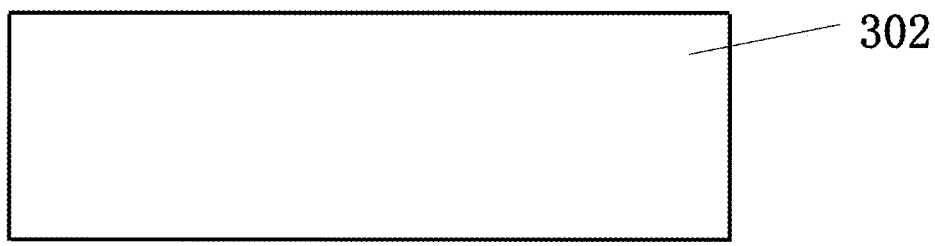
FIG. 7 shows a structural diagram in a first step in the fabrication process of a transfer head for transferring the micro element according to Embodiment 2, which may include: providing a suite (or kit).

Referring to FIG. 7, provide a suite 302, which can be metal, Si, porcelain, glass, plastic or any of their combination. In this embodiment, Si substrate is preferred.

Figure 8:
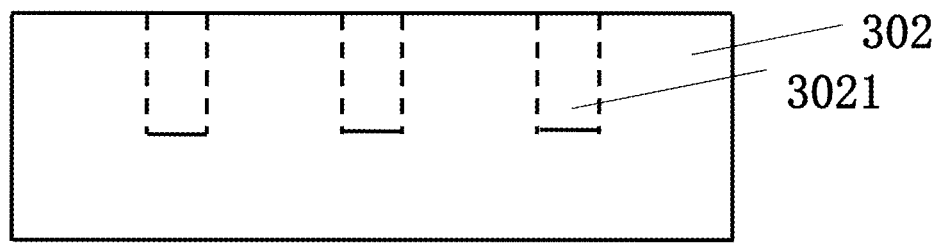
FIG. 8 shows a structural diagram in a second step in the fabrication process of a transfer head for transferring the micro element according to Embodiment 2, which may include: forming an array micro-hole structure over the Si substrate.

Referring to FIG. 8, form an array micro-hole structure 3021 over the Si substrate, wherein, the array micro-hole structure can serve as the vacuum path component or the suction nozzle. The array micro-hole structure is formed through wire drawing, through-silicon via (TVS), laser treatment or any of their combinations. In this embodiment, laser boring is preferred, wherein, the laser beam with power density of $10^8$-$10^{10}$ W/cm$^2$ is used. Diameter W of the array micro-hole structure 3021 is 1-100 μm, and spacing D is 1-100 μm.

Figure 9:
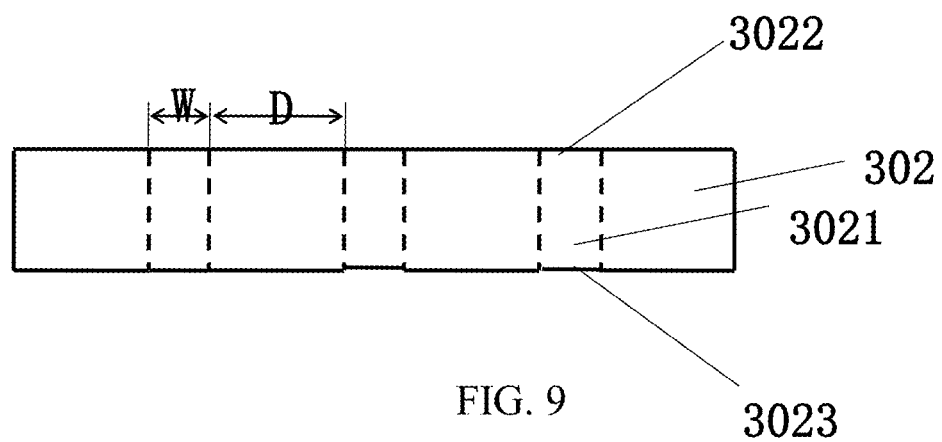
FIG. 9 shows a structural diagram in a third step in the fabrication process of a transfer head for transferring the micro element according to Embodiment 2, which may include: thinning the Si substrate.

Referring to FIG. 9, thin the Si substrate. Before thinning, the Si substrate is 0.01-0.6 mm but is not limited in this range. The film thickness can be adjusted based on actual requirements. Preferably, the Si substrate is 0.01-0.4 mm thick. Preferably, the Si substrate is 0.1-0.3 mm thick. Thinning is achieved by grinding, chemical mechanical polishing or plasma etching. After thinning, form a first opening 3022 and a second opening 3023 over the upper surface and the lower surface of the array micro-hole structure 3021 respectively, wherein, the first opening is larger than or equals to the second opening. Preferably, the first opening is equal to the second opening in this embodiment.

Figure 10:
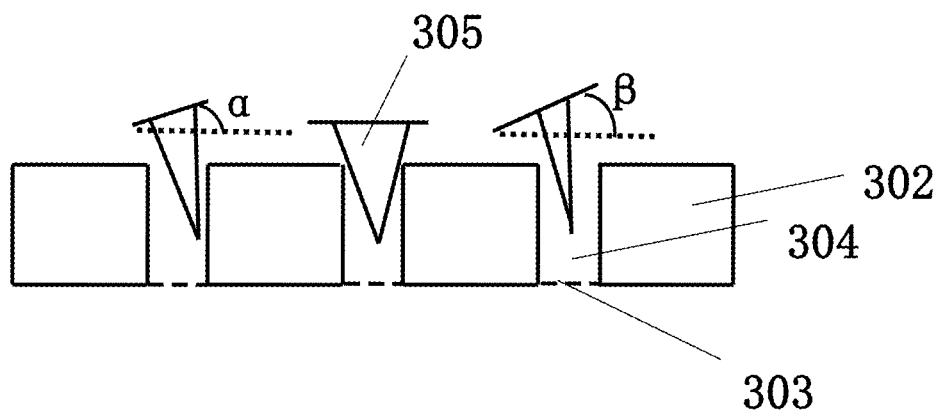
FIG. 10 shows a structural diagram in a fourth step in the fabrication process of a transfer head for transferring the micro element according to Embodiment 2, which may include: fabricating an optical switching component in the first opening.

Referring to FIG. 10, fabricate an optical switching component 305 in the first opening 3022, which prefers to include a DMD chip with a micro reflector. Preferably, in this embodiment, the array micro-hole structure 3021 serves as the vacuum path component 304, and the second opening 3023 serves as the suction nozzle 303 without addition fabrication of a suction nozzle.

Figure 11:
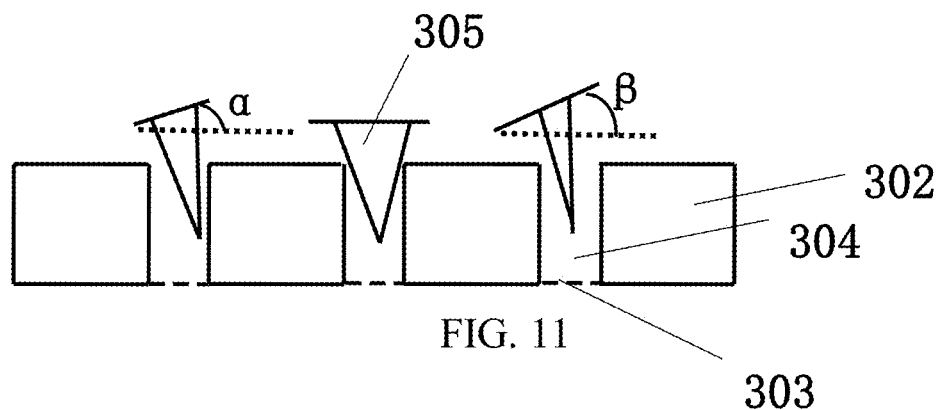
FIG. 11 shows a structural diagram in a fifth step in the fabrication process of a transfer head for transferring the micro element according to Embodiment 2, which may include: fabricating a cavity with vacuum paths above the suite to form a transfer head.

Referring to FIG. 11, fabricate a cavity with vacuum paths 301 above the suite 302 to form a transfer head 300 for transferring the micro element.

Figure 12:
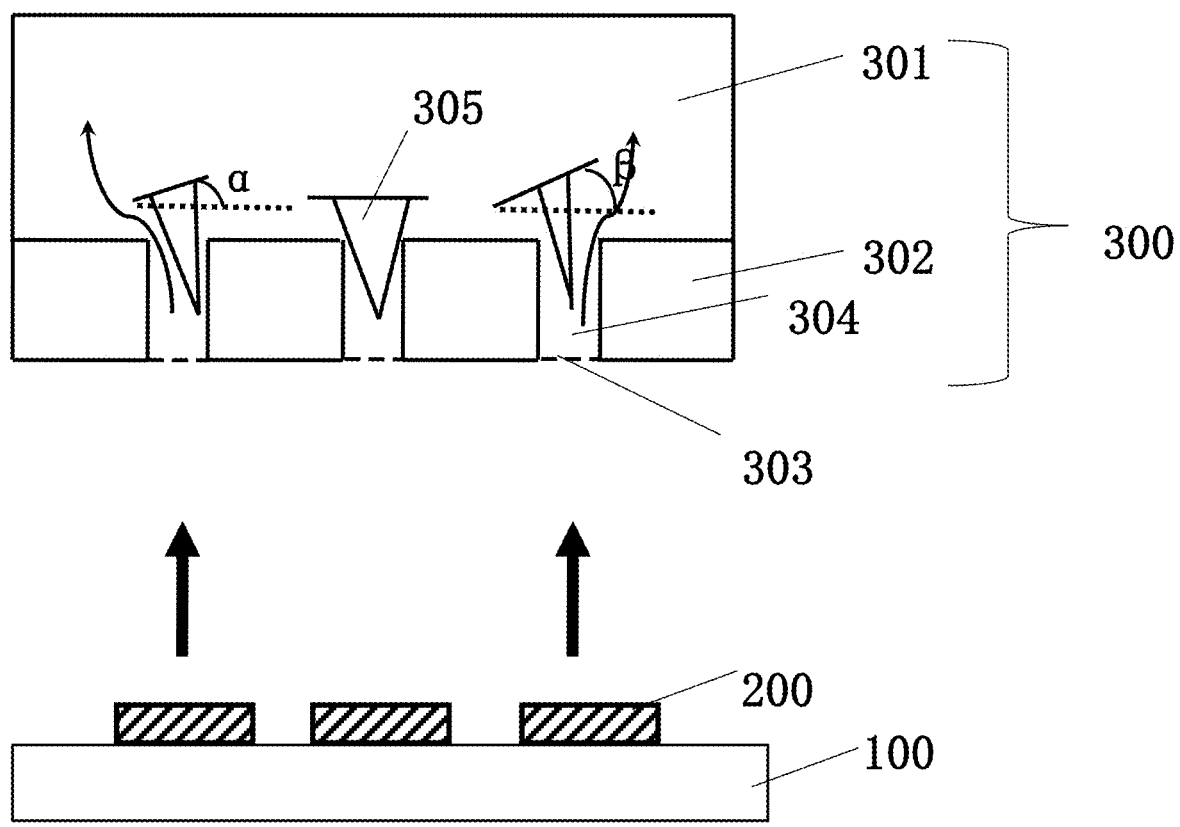
FIG. 12 shows a diagram of the transfer head for transferring the micro element according to Embodiment 2 of the present disclosure.

FIG. 12 illustrates how the transfer head is used for transferring the micro element according to Embodiment 1 of the present disclosure.

Provide a substrate 100, which can be a growth substrate or a carrier substrate. In this embodiment, a carrier substrate is preferred, which can be glass, silicon, polycarbonate, acrylonitrile butadiene styrene or any of their combinations. It should be noted that specific embodiments of the carrier substrate aforesaid are only for illustration, and shall not be deemed as a limitation of the present disclosure. The person having ordinary skill in the art shall select specific embodiments of the substrate 100 based on actual requirements. Arrange a plurality of micro elements 200 over the substrate 100, wherein, the micro element can be a wafer before wafer processing technology, a light-emitting diode or a laser diode. In this embodiment, the micro element prefers to be a thin light-emitting diode with thickness of about 0.5 μm to about 100 μm. The micro element 200 can be a cylinder with radius of about 0.5 μm to about 500 μm. However, the micro element 200 is not limited to cylinder, but can be triangular column, cube, rectangular, hexagonal column, octagonal column or other polygonal cylinders.

Orient the transfer head 300 towards and contacts it with the micro element 200 over the substrate 100, wherein, the transfer head 300 includes: a cavity with vacuum paths 301; a suite 302 having array suction nozzles 303 and array vacuum path components 304, wherein, the suction nozzles 303 are connected to the vacuum path components 304 respectively, and the vacuum path components 304 are formed to connect to vacuum paths in the cavity 301 respectively, and the suction nozzles 303 attract or release the micro element through vacuum pressure, which is transmitted by vacuum path components and vacuum paths of each path. When the suite 302 is mounted in the cavity with vacuum paths 301, the upper surface of the suite is arranged with photoelectric switching components 305 for controlling the switch of the vacuum path components and vacuum paths of each path so that the suction nozzles can attract or release required micro element through vacuum pressure. In this embodiment, number of the suction nozzles, vacuum path components and micro elements is 3 each. Define the suction nozzles/vacuum path components/micro elements in FIG. 12 from left to bottom as the first, the second and the third suction nozzle/vacuum path component/micro element. To attract the first and the third micro-element over the carrier substrate 100, set the path of the first vacuum path component and vacuum path to ON status, the path of the second vacuum path component and vacuum path to OFF status, and the path of the third vacuum path component and vacuum path to ON with the photoelectric switching component 305. Specifically, the photoelectric switching component 305 prefers to includes a DMD chip, wherein, the DMD chip has a micro reflector to control the switch of the vacuum path components and vacuum paths of each path by changing the angle between the micro reflector and the upper surface of the suite. Preferably, the angle equals to or is less than 12°. When the angle is zero, the path of the second vacuum path component and vacuum path is OFF; when the angle α=8°, the path of the first vacuum path components and vacuum paths is ON; when the angle β=12°, the path of the third vacuum path components and vacuum paths is ON It should be noted that by changing the angle between the micro reflector and the upper surface of the suite, the switch of the vacuum path components and vacuum paths of each path can be controlled, and the vacuum pressure can also be adjusted.

As shown above, the transfer head 300 orients and contacts the micro element 200 over the substrate 100, wherein, the suction nozzle attracts the micro element through vacuum pressure, and controls switch of the vacuum path components and vacuum paths of each path by the photoelectric switching component to extract required micro element. Provide an acceptor substrate (not illustrated), wherein, the transfer head 300 orients towards this acceptor substrate. The acceptor substrate can be automotive glass, glass sheet, flexible electronic substrate, such as flexible film of path, display back plate, solar glass, metal, polymer, polymer compound and glass fiber. The suction nozzle 303 releases the micro element 200 through vacuum pressure, and controls switch of the vacuum path components and vacuum paths of each path with the photoelectric switching component 305, to release required micro element over the acceptor substrate.

The transfer head transferring method for the micro element according to this embodiment can also be used for fabricating electronic device, or be widely applied in electronic devices like mobile phone, tablet PC, etc.

Embodiment 3

Figure 13:
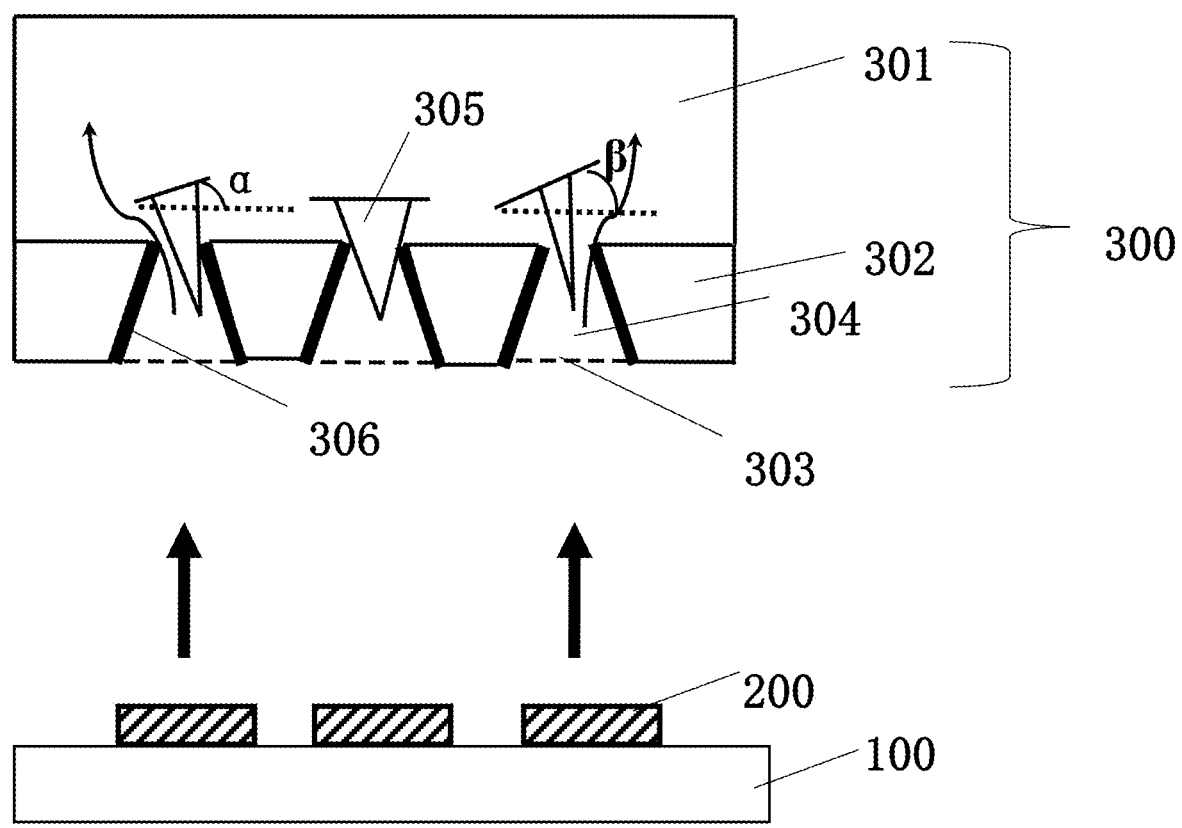
FIG. 13 shows a diagram of the transfer head for transferring the micro element according to Embodiment 3 of the present disclosure.

Referring to FIG. 13, the difference between this embodiment and Embodiment 2 is that: the array micro-hole structure 3021 is formed through through-silicon via (TVS) with drilling depth less than 20 μm. Diameter W of the array micro-hole structure 3021 is 1-100 μm, and spacing D is 1-100 μm. The first opening 3022 is smaller than the second opening 3023, which facilitates absorption of the suction nozzle. In addition, a functional layer 306, such as a conductive layer, an insulating layer or other functional layers, is formed over the inner surface of the array micro-element structure. Preferably, the functional layer is a metal reinforcement layer.

Embodiment 4

Figure 14:
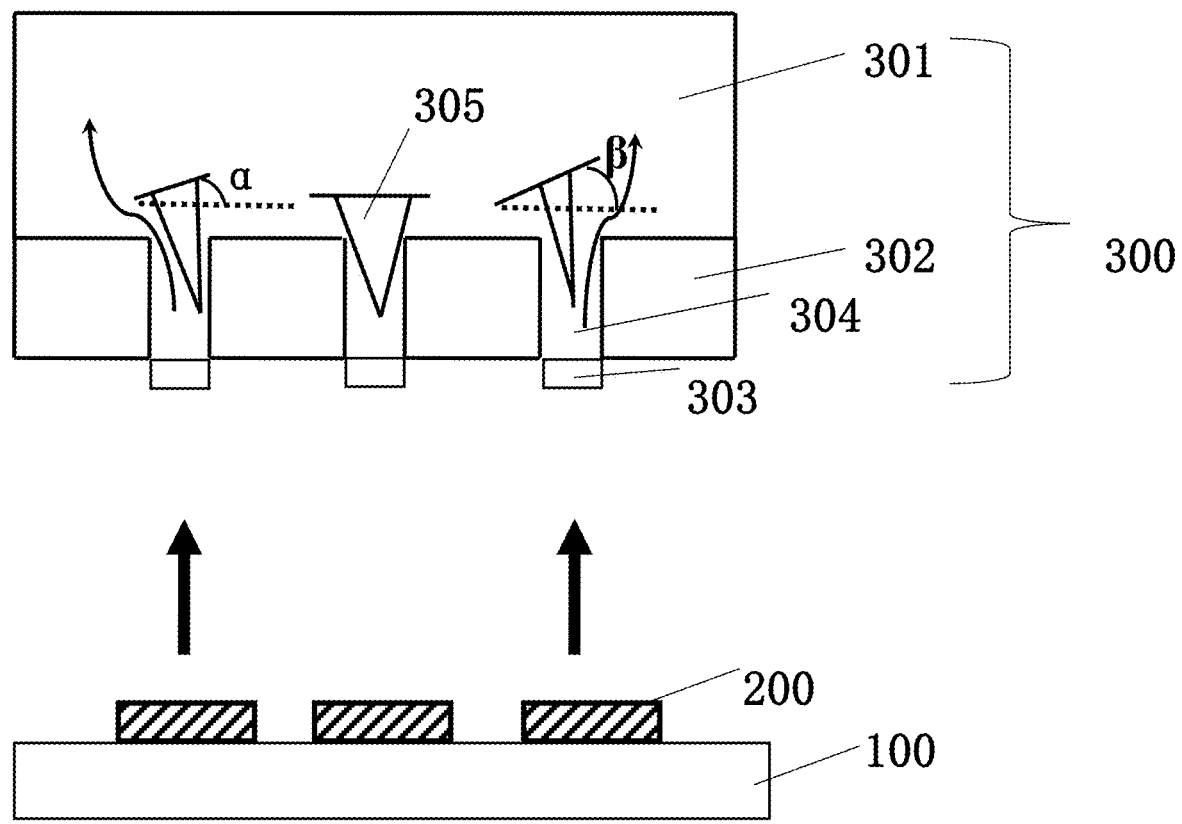
FIG. 14 shows a diagram of the transfer head for transferring the micro element according to Embodiment 4 of the present disclosure.

Referring to FIG. 14, the difference between this embodiment and Embodiment 2 is that: a suction nozzle is fabricated in the second opening 3023 of the array micro-hole structure 3021, which can be metal, Si, porcelain, glass, plastic or any of their combination. In this embodiment, PVDF is preferred. The suction nozzle process can be wire drawing, through-silicon via (TVS) or laser treatment or any of their combinations. In this embodiment, wire drawing is preferred.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A method of making a transfer head for transferring micro elements, wherein the transfer head comprises:
   a cavity with a plurality of vacuum paths;
   a suite having arrayed suction nozzles and vacuum path components;
   wherein:
      the suction nozzles are connected to the vacuum path components respectively, and the vacuum path components are formed to connect to vacuum paths in the cavity respectively;
      the suction nozzles attract or release the micro element through vacuum pressure, which is transmitted by vacuum path components and vacuum paths of each path;
      in a case that the suite is mounted in the cavity, an upper surface of the suite is arranged with optical switching components configured to control switching of the vacuum path components and vacuum paths of each path to facilitate the suction nozzles attracting or releasing a required micro element through vacuum pressure; and
      fabricating the suite with an array micro-hole structure, wherein the array micro-hole structure serves as the vacuum path components and the suction nozzles;
      wherein the array micro-hole structure is formed through at least one of laser treatment, through-silicon via (TVS), or wire drawing.

2. A method of making a transfer head for transferring micro elements, wherein the transfer head comprises:
   a cavity with a plurality of vacuum paths;
   a suite having arrayed suction nozzles and vacuum path components;
   wherein:
      the suction nozzles are connected to the vacuum path components respectively, and the vacuum path components are formed to connect to vacuum paths in the cavity respectively;
      the suction nozzles attract or release the micro element through vacuum pressure, which is transmitted by vacuum path components and vacuum paths of each path;
      in a case that the suite is mounted in the cavity, an upper surface of the suite is arranged with optical switching components configured to control switching of the vacuum path components and vacuum paths of each path to facilitate the suction nozzles attracting or releasing a required micro element through vacuum pressure; and
      fabricating the suite with an array micro-hole structure, wherein the array micro-hole structure serves as the vacuum path components and the suction nozzles;
      wherein the array micro-hole structure has a first opening and a second opening, wherein, the first opening is larger than or equals to the second opening.

3. A method of making a transfer head for transferring micro elements, wherein the transfer head comprises:
   a cavity with a plurality of vacuum paths;
   a suite having arrayed suction nozzles and vacuum path components;
   wherein:
      the suction nozzles are connected to the vacuum path components respectively, and the vacuum path components are formed to connect to vacuum paths in the cavity respectively;
      the suction nozzles attract or release the micro element through vacuum pressure, which is transmitted by vacuum path components and vacuum paths of each path;
      in a case that the suite is mounted in the cavity, an upper surface of the suite is arranged with optical switching components configured to control switching of the vacuum path components and vacuum paths of each path to facilitate the suction nozzles attracting or releasing a required micro element through vacuum pressure; and
      fabricating the suite with an array micro-hole structure, wherein the array micro-hole structure serves as the vacuum path components and the suction nozzles;
      wherein a size of the array micro-hole structure is 1-100 µm.

4. The method of claim 1, wherein a spacing of the array micro-hole structure is 1-100 µm.

5. The method of claim 1, wherein the suite is composed of a material comprising at least one of metal, Si, porcelain, glass, or plastic.

6. The method of claim 1, wherein the suction nozzles are composed of a material comprising at least one of metal, Si, porcelain, glass, or plastic.

7. The method of claim 1, wherein a conductive layer, an insulating layer or other functional layers are formed over an inner surface of the array micro-element structure.

8. The method of claim 1, wherein the optical switching components comprise a digital micromirror device (DMD) chip; the DMD chip comprises a micro reflector; and by changing an angle between the micro reflector and the upper surface of the suite, the switching of the vacuum path components and the vacuum paths of each path are controllable.

9. A transfer method for transferring micro elements, the method comprising making the transfer head according to the method of making of claim 1; the transfer method further comprising:

(1) placing at least one micro element over a first substrate;
(2) apply the transfer head to orient and contact the micro element, wherein the transfer head comprises:
a cavity with a plurality of vacuum paths; and
a suite having a plurality of suction nozzles and vacuum path components;
wherein:
the suction nozzles are connected to the vacuum path components respectively, and the vacuum path components are formed to connect to vacuum paths in the cavity respectively;
the suction nozzles attract or release the micro element through vacuum pressure, which is transmitted by vacuum path components and vacuum paths of each path; and
when the suite is mounted in the cavity, an upper surface of the suite is arranged with optical switching components for controlling the switch of the vacuum path components and vacuum paths of each path so that the suction nozzles can attract or release required micro element through vacuum pressure;
the suction nozzle is configured to attract the micro element through vacuum pressure, and controls switch of the vacuum path components and vacuum paths of each path via the optical switching component to extract required micro element; and
(3) applying the transfer head to orient and contact the second substrate, wherein, the suction nozzle releases the micro element through vacuum pressure, and controls switch of the vacuum path components and vacuum paths of each path via the optical switching component to release required micro element over the second substrate.

10. The transfer method of claim 9, wherein
a plurality of micro elements are provided;
in step (2), only part of the micro elements are attracted to extract required micro element; and
in step (3), only part of the micro elements are repelled to release required micro element.

11. The transfer method of claim 9, wherein the optical switching component comprises a digital micromirror device (DMD) chip.

12. The transfer method of claim 11, wherein
the DMD chip comprises a micro reflector; and
by changing an angle between the micro reflector and the upper surface of the suite, the switch of the vacuum path components and vacuum paths of each path are controllable.

13. The transfer method for the micro element of claim 12, wherein the angle is 12° or less.

14. The transfer method of claim 12, wherein
when the angle is zero, the vacuum path components and vacuum paths of each path are OFF; and
when the angle is not zero, the vacuum path components and vacuum paths of each path are ON.

* * * * *